US010181466B2

(12) United States Patent
Wang et al.

(10) Patent No.: US 10,181,466 B2
(45) Date of Patent: Jan. 15, 2019

(54) ELECTROSTATIC DISCHARGE PROTECTION APPARATUS AND APPLICATIONS THEREOF

(71) Applicant: MACRONIX INTERNATIONAL CO., LTD., Hsinchu (TW)

(72) Inventors: Shih-Yu Wang, Taipei (TW); Ming-Yin Lee, Hsinchu (TW); Wen-Tsung Huang, Changhua County (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 283 days.

(21) Appl. No.: 15/084,557

(22) Filed: Mar. 30, 2016

(65) Prior Publication Data

US 2017/0287899 A1    Oct. 5, 2017

(51) Int. Cl.
| H01L 27/02 | (2006.01) |
| H02H 9/04 | (2006.01) |
| H01L 29/10 | (2006.01) |
| H01L 27/105 | (2006.01) |
| G11C 7/24 | (2006.01) |
| H01L 29/06 | (2006.01) |
| H01L 23/50 | (2006.01) |
| H01L 27/06 | (2006.01) |

(52) U.S. Cl.
CPC .......... *H01L 27/0277* (2013.01); *G11C 7/24* (2013.01); *H01L 23/50* (2013.01); *H01L 27/0629* (2013.01); *H01L 27/105* (2013.01); *H01L 29/0688* (2013.01); *H01L 29/1079* (2013.01); *H01L 29/1095* (2013.01); *H02H 9/046* (2013.01)

(58) Field of Classification Search
CPC ........ H01L 27/0277; H02H 9/046; G11C 7/24
See application file for complete search history.

(56) References Cited

U.S. PATENT DOCUMENTS

| 2011/0248383 A1* | 10/2011 | Ren ..................... H01L 27/0259 257/577 |
| 2013/0140626 A1* | 6/2013 | Shrivastava ...... H01L 21/26586 257/328 |
| 2014/0183708 A1* | 7/2014 | Wang .................... H01L 21/265 257/659 |

* cited by examiner

*Primary Examiner* — Scott Bauer
(74) *Attorney, Agent, or Firm* — McClure, Qualey & Rodack, LLP

(57) ABSTRACT

An ESD protection apparatus includes a semiconductor substrate, a first gate structure, a first doping region, a second doping region and a third doping region. The semiconductor substrate has a doping well with a first conductivity one end of which is grounded. The first gate structure is disposed on the doping well. The first doping region having a second conductivity, is disposed in the doping well and adjacent to the first gate structure, and is electrically connected to a pad. The second doping region having the second conductivity is disposed in the doping well and adjacent to the first gate structure. The third doping region having the first conductivity is disposed in the doping well and forms a P/N junction interface with the second doping region, wherein the second doping region and the third doping region respectively have a doping concentration substantially greater than that of the doping well.

17 Claims, 6 Drawing Sheets

ELECTROSTATIC DISCHARGE PROTECTION APPARATUS AND APPLICATIONS THEREOF

BACKGROUND

Technical Field

The disclosure in generally relates to a semiconductor integrated circuit (IC) and the applications thereof, and more particularly to an electrostatic discharge (ESD) protection apparatus and the applications thereof.

Description of the Related Art

ESD is the transmission of accumulated electrostatic charge between two different objects with unequal electrical potentials. High-density current with extremely high electrical potential may transmitted within a very short time interval. And, a semiconductor device may be burnt down when the ESD current passing there through. It is necessary to provide an EDS protection apparatus and a discharge circuit preventing the semiconductor device from being damaged by ESD current resulted from a human body or a machine.

To take an ESD protection apparatus applied in an integration circuit as an example, a plurality of metal-oxide-semiconductor (MOS) transistors that may configure a parasitic bipolar junction transistor (BJT) circuit in the integration circuit are applied between an input/output (I/O) pad and an internal circuit to protect the internal circuit from being damaged by ESD current directed into the integration circuit from the I/O pad. In order to improve the ESD tolerances of the MOS transistors and save the layout size of the semiconductor integration circuit, the MOS transistors are typically designed as a multi-finger-shaped structure.

However, these MOS transistors with multi-finger-shaped structure cannot be triggered on uniformly due to the difference in the distance between each of the MOS transistors and the I/O pad. ESD current may be concentrated and discharged into the ground through some particular MOS transistors, and these particular MOS transistors may be overloaded and burnt down by the concentrated ESD current. Such that, how to improve the triggering uniformity of the multi-finger-shaped MOS transistors without significantly enlarging the layout size of the ESD protection apparatus is still a challenge to the pertinent industry.

Therefore, there is a need of providing an improved ESD protection apparatus and the applications thereof to obviate the drawbacks encountered from the prior art.

SUMMARY

One aspect of the present disclosure is to provide an ESD protection apparatus, wherein the ESD protection apparatus includes a semiconductor substrate, a first gate structure, a first doping region, a second doping region and a third doping region. The semiconductor substrate has a doping well with a first conductivity, wherein one end of the doping well is grounded. The first gate structure is disposed on the doping well. The first doping region having a second conductivity, is disposed in the doping well and adjacent to the first gate structure, and is electrically connected to a pad. The second doping region having the second conductivity is disposed in the doping well and adjacent to the first gate structure. The third doping region having the first conductivity is disposed in the doping well and forms a P/N junction interface with the second doping region, wherein the second doping region and the third doping region respectively have a doping concentration substantially greater than that of the doping well.

Another aspect of the present disclosure is to provide a memory device, wherein the memory device includes an aforementioned ESD protection apparatus and a memory cell array electrically connected to the pad of the ESD protection apparatus.

Yet another aspect of the present disclosure is to provide an ESD protection including steps as follows: An ESD protection apparatus is firstly provided, wherein the ESD protection apparatus includes a semiconductor substrate, a first gate structure, a first doping region, a second doping region and a third doping region. The semiconductor substrate has a doping well with a first conductivity one end of which is grounded. The first gate structure is disposed on the doping well. The first doping region having a second conductivity, is disposed in the doping well and adjacent to the first gate structure, and is electrically connected to a pad. The second doping region having the second conductivity is disposed in the doping well and adjacent to the first gate structure. The third doping region having the first conductivity is disposed in the doping well and forms a P/N junction interface with the second doping region, wherein the second doping region and the third doping region respectively have a doping concentration substantially greater than that of the doping well. Using the ESD protection apparatus to direct an ESD current into ground through the semiconductor substrate, when an ESD stress is imposed on the pad.

In accordance with the aforementioned embodiments of the present disclosure, an ESD protection apparatus and applications thereof are provided. The ESD protection apparatus includes a MOS transistor and a doping region both formed in a doping well of a semiconductor substrate, wherein the MOS transistor has a conductivity different from that of the doping well; the doping region has a conductivity identical to that of the doping well; and the doping region forms a P/N junction interface with a source (or drain) of the MOS transistor. One end of the doping well is grounded; the drain (or source) of the MOS transistor that is not used to form the P/N junction interface is electrically connected to an input (or output) pad; and the concentrations of the doping region and the source/drain of the MOS transistor are substantially greater than that of the doping well.

Because the doping region and the source (or drain) of the MOS transistor used to form the P/N junction interface have concentrations substantially greater than that of the doping well. The reverse breakdown voltage of the P/N junction interface could be small enough to be ignored. When the parasitic BJT circuit of the MOS transistor is triggered by high-voltage, the ESD current that is directed into the MOS transistor through the input (or output) pad may drive the, charge carriers, such as free electrons and holes, coming from the base of the parasitic BJT tunneling through the P/N junction interface. Such that, the ESD current can be directed into the doping well, meanwhile the substrate bias of the doping well can be increased, the breakthrough voltage of the MOS transistor can be reduced by the increased substrate bias, and the other MOS transistors that are formed in the doping well can be turn on simultaneously for discharging the ESD current.

By this approach, the MOS transistors with multi-finger-shaped structure formed in the doping well can be turn-on more uniformly, and the overloaded and burnt down problems of the particular MOS transistor due to non-uniform turn-on can be solved.

BRIEF DESCRIPTION OF THE DRAWINGS

The above objects and advantages of the present disclosure will become more readily apparent to those ordinarily skilled in the art after reviewing the following detailed description and accompanying drawings, in which.

DETAILED DESCRIPTION

Figure 1A:
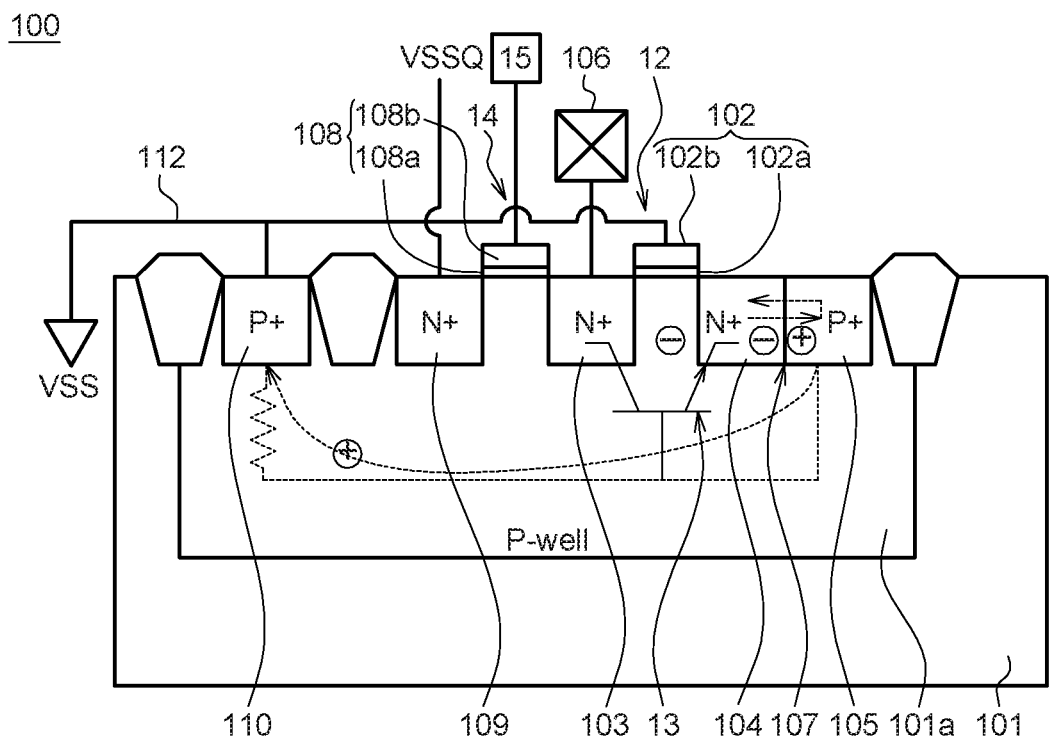
FIG. 1A is a cross-sectional view illustrating an ESD protection apparatus in accordance with one embodiment of the present invention.

The embodiments as illustrated below provide an ESD protection apparatus and applications thereof to solve the non-uniform turn-on problems of the MOS transistors with multi-finger-shaped structure. The present invention will now be described more specifically with reference to the following embodiments illustrating the structure and arrangements thereof.

It is to be noted that the following descriptions of preferred embodiments of this invention are presented herein for purpose of illustration and description only. It is not intended to be exhaustive or to be limited to the precise form disclosed. Also, it is also important to point out that there may be other features, elements, steps and parameters for implementing the embodiments of the present disclosure which are not specifically illustrated. Thus, the specification and the drawings are to be regard as an illustrative sense rather than a restrictive sense. Various modifications and similar arrangements may be provided by the persons skilled in the art within the spirit and scope of the present invention. In addition, the illustrations may not be necessarily be drawn to scale, and the identical elements of the embodiments are designated with the same reference numerals.

Figure 1B:
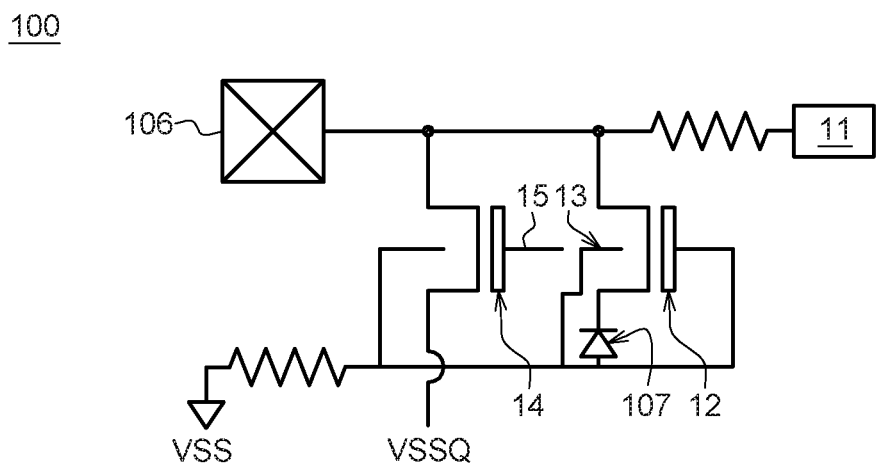
FIG. 1B illustrates an equivalent circuit diagram of the ESD protection apparatus depicted in FIG. 1A.

FIG. 1A is a cross-sectional view illustrating an ESD protection apparatus 100 in accordance with one embodiment of the present invention; and FIG. 1B illustrates an equivalent circuit diagram of the ESD protection apparatus 100 depicted in FIG. 1A. In the present embodiment, the ESD protection apparatus 100 is used to protect an internal circuit 11 from being damaged by ESD current. The ESD protection apparatus 100 includes a semiconductor substrate 101, a first gate structure 102, a first doping region 103, a second doping region 104 and a third doping region 105.

In some embodiments of the present disclosure, the semiconductor substrate 101 can be made of semiconductor materials (such as silicon (Si), germanium (Ge), and so on), compound semiconductor materials (such as silicon carbide (SiC), gallium arsenide (GaAs), iodine phosphide (IP), phosphide (GaP), iodine arsenide (IAs) and/or iodine antimony (ISb)). In the present embodiment, the substrate 101 can be a silicon wafer having a doping well 101a with a p type conductivity (also referred to as P-Well).

The first gate structure 102 has a gate dielectric layer 102a and a gate electrode 102b, wherein the gate dielectric layer 102a is disposed on the doping well 101a, and the gate electrode 102b is stacked on the gate dielectric layer 102a.

The first doping region 103 is disposed in the doping well 101a and adjacent to the gate dielectric layer 102a of the first gate structure 102, and is electrically connected to a pad 106. In some embodiments of the present disclosure, the first doping region 103 has n-type conductivity opposite to that of the doping well 101a and has a doping concentration (also referred to as N+) substantially greater than that of the doping well 101a. In the present embodiment, the doping well 101a has a doping concentration substantially ranging from $1.0 \times 10^{16}/cm^3$ to $1.0 \times 10^{17}/cm^3$; and the doping concentration of the first doping region 103 ranges from $1.0 \times 10^{19}/cm^3$ to $1.0 \times 10^{20}/cm^3$.

The function of the pad 106 may vary in accordance with the design of the internal circuit 11. For example, the internal circuit 11 may be an integrated circuit having at least one memory cell array. The pad 106 may act as an I/O pad connecting the internal circuit 11 and an external circuit (not shown) for outputting driving current from the internal circuit 11 and receiving control signal from the external circuit. However, in some other embodiments of the present disclosure, the pad 106 may act merely as an input pad.

The second doping region 104 having n-type conductivity is disposed in the doping well 101a and adjacent to the gate dielectric layer 102a of the first gate structure 102. Similar to the first doping region 103, the first doping region 103 has a doping concentration (also referred to as N+) substantially greater than that of the doping well 101a. In the present embodiment, the doping concentration of the second doping region 104 ranges from $1.0 \times 10^{19}/cm^3$ to $1.0 \times 10^{20}/cm^3$.

In detail, the combination of the first gate structure 102, the first doping region 103 and the second doping region 104 can form an NMOS transistor 12. In the present embodiment, the gate (the gate electrode 102b) of NMOS transistor 12 electrically connects to the ground (designated as VSS) through a conductive line 112; the drain (the first doping region 103) is electrically connected to the pad 106; and the combination of the first doping region 103, the second doping region 104 and the doping well 101a form an NPN BJT circuit 13 (see FIG. 1A).

The third doping region 105 having p-type conductivity is disposed in the doping well 101a and forms a P/N junction interface 107 with the second doping region 104. Similar to the first doping region 103, the third doping region 105 has a doping concentration (also referred to as P+) substantially greater than that of the doping well 101a. In the present embodiment, the doping concentration of the third doping region 105 ranges from $1.0 \times 10^{19}/cm^3$ to $1.0 \times 10^{20}/cm^3$. Since doping concentration the second doping region 104b and the third doping region 105 that are used to form the P/N junction interface 107 respectively have a substantially greater than that of the doping well 101a, charge tunneling effect can be triggered more easily, thus the reverse breakdown voltage of the P/N junction interface 107 could be very small. In the present embodiment, the reverse breakdown voltage of the P/N junction interface 107 may range from 0.7V to 3V.

The ESD protection apparatus 100 further includes a second gate structure 108, a fourth doping region 109 and a fifth doping region 110. The second gate structure 108 includes a second gate dielectric layer 108a and a second gate electrode 108b sequentially stacked on the doping well 101a, wherein the second gate dielectric layer 108a is disposed adjacent to the first doping region 103. The fourth doping region 109 having n-type conductivity is disposed in the doping well 101a and adjacent to the second gate dielectric layer 108a of the gate structure 108. In the present embodiment, the structure and doping concentration of the fourth doping region 109 are similar to that of the first doping region 103. Such that, in the drawings, the fourth doping region 109 is also designated as an N+ region.

The combination of the second gate structure 108, the first doping region 103 and the fourth doping region 109 can form another NMOS transistor 14 having a common drain (the first doping region 103) with the NMOS transistor 12, wherein the source (the fourth doping region 109) of the NMOS transistor 14 is connected to the ground (designated as VSSQ); the gate of the NMOS transistor 14 (the second gate electrode 108b) is electrically connected to an I/O circuit 15 used to output or receive signal trough the NMOS transistor 14 and the pad 106 during a normal operation.

The fifth doping region 110 having p-type conductivity is disposed in the doping well 101a at the side of the NMOS transistor 14 departing from the NMOS transistor 12 and is connected to the ground (designated as VSS) through the conductive line 112. In the present embodiment, the structure and doping concentration of the fifth doping region 110 are similar to that of the third doping region 105. Such that, in the drawings, the fifth doping region 110 is also designated as a P+ region.

Because the second doping region 104 and the third doping region 105 used to form the P/N junction interface 107 as well as the drain (the first doping region 103) have concentrations substantially greater than that of the doping well 101a. The reverse breakdown voltage of the P/N junction interface 107 could be small enough to be ignored. When the parasitic NPN BJT circuit 13 of the NMOS transistor 12 is triggered by an high-forward-voltage, the ESD current that are directed into the NMOS transistor 12 through the input (or output) pad 106 may drive charge carriers, such as free electrons and holes, coming from the base (the doping well 101a) of the parasitic NPN BJT 13 tunneling through the P/N junction interface 107. Such that, the ESD current can be directed into the doping well 101a and then flowing into the ground (designated as VSS), meanwhile the substrate bias of the doping well 101a can be increased, the breakthrough voltage of the NMOS transistor 14 can be reduced by the increased substrate bias, and the other MOS transistors, including the NMOS transistor 14, that are formed in the doping well 101a can be turn on simultaneously for discharging the ESD current.

By the aforementioned approach, the electrical potential of the doping well 101a can be effectively increased, and the turn-on uniformity of these MOS transistors, such as the MOS transistors 12 and 14, formed in the doping well 101a can be improved by adding a doping region (such as the third doping region 105) in the doping well 101a and forming a P/N junction interface 107 with the source/drain (such as the) of the MOS transistor (such as the NMOS transistor 12) which is firstly turn on by the ESD current, without unreasonably increase the size of the ESD protection apparatus 100. The MOS transistor that is firstly triggered may not burnt down by the overloaded ESD current.

Figure 2:
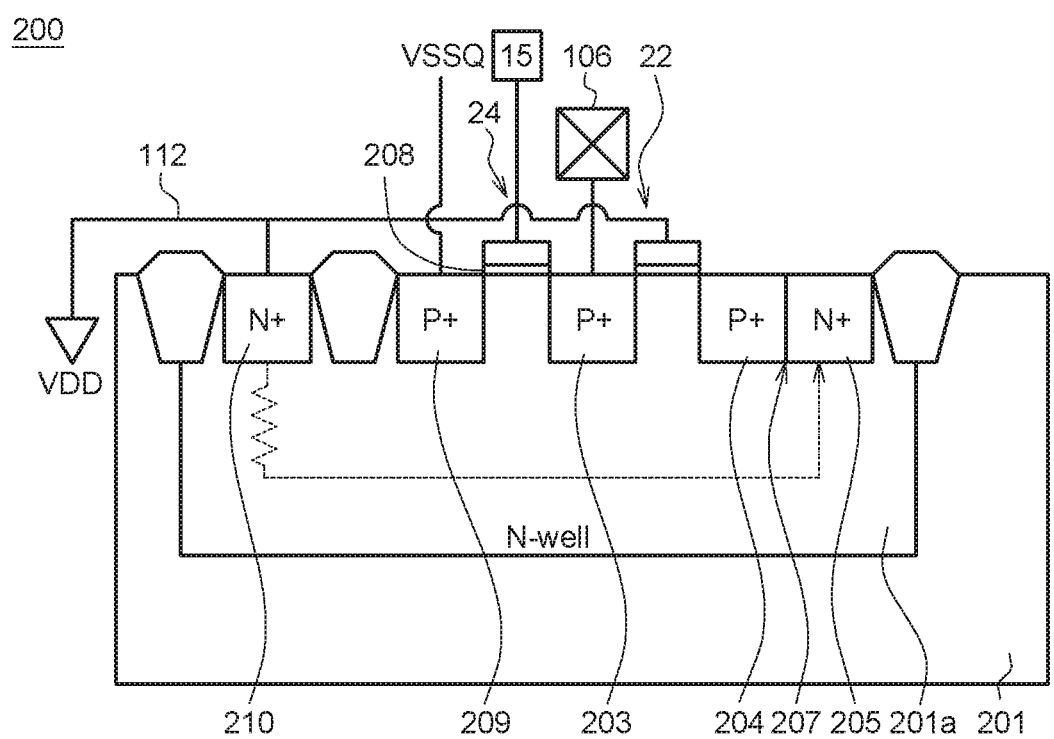
FIG. 2 is a cross-sectional view illustrating an ESD protection apparatus in accordance with another embodiment of the present invention.

FIG. 2 is a cross-sectional view illustrating an ESD protection apparatus 200 in accordance with another embodiment of the present invention. The structure of the ESD protection apparatus 200 is similar to that of the ESD protection apparatus 100 which is depicted in FIGS. 1A and 1B except that the conductivities of the substrate 201, the doping well 201a, the first doping region 203, the second doping region 204, the third doping region 205, the fourth doping region 209, the parasitic BJT 23 and the fifth doping region 210 are just the reverse of what the substrate 101, the doping well 101a, the first doping region 103, the second doping region 104, the third doping region 105, the fourth doping region 109, the parasitic BJT 13 and the fifth doping region 110 have.

Similarly, when the parasitic PNP BJT circuit 23 of the MOS transistor 22 is triggered by an high-reverse-voltage, the ESD current that are directed into the MOS transistor 22 through the input (or output) pad 106 may drive charge carriers, such as free electrons and holes, coming from the base (the doping well 201a) of the parasitic PNP BJT 23 tunneling through the P/N junction interface 207. Such that, the ESD current can be directed into the doping well 201a and then flowing into the power supply (designated as VDD), meanwhile the substrate bias of the doping well 201a can be increased, the breakthrough voltage of the MOS transistor 24 can be reduced by the increased substrate bias, and the other MOS transistors, including the MOS transistor 24, that are formed in the doping well 201a can be turn on simultaneously for discharging the ESD current. Since the structure, materials and method for fabricating the ESD protection apparatus 100 that has reverse conductivity of the ESD protection apparatus 200 have being disclosed above, the structure, materials and method for fabricating the ESD protection apparatus 200 will not be redundantly described.

Figure 3A:
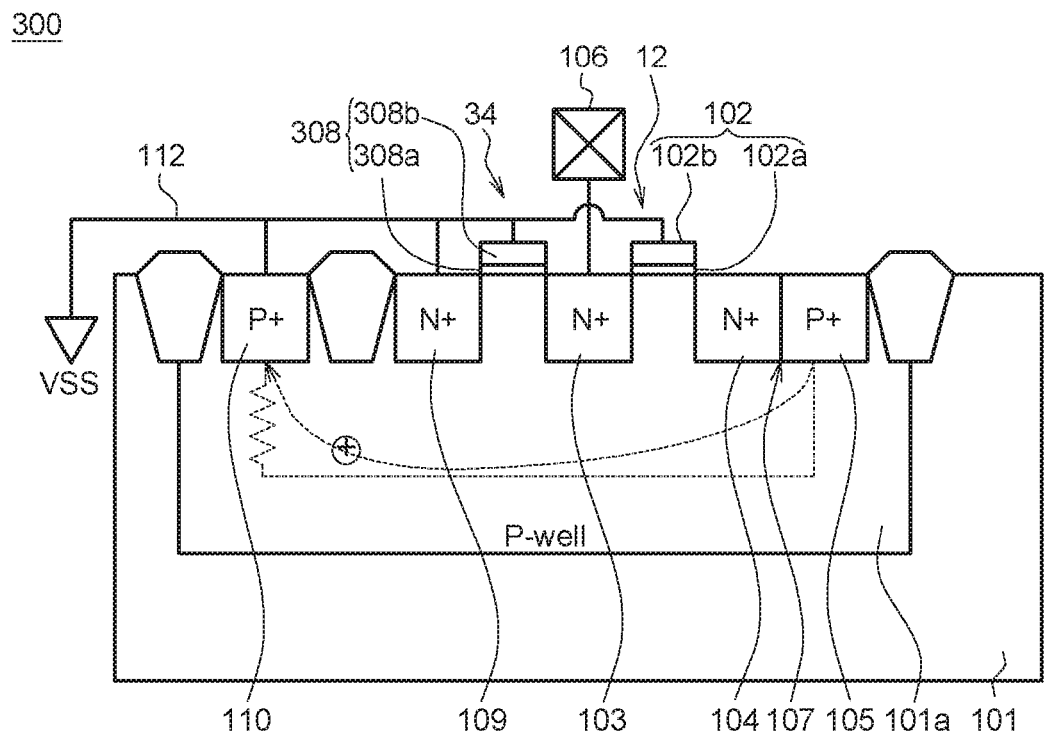
FIG. 3A is a cross-sectional view illustrating an ESD protection apparatus in accordance with yet another embodiment of the present invention.
Figure 3B:
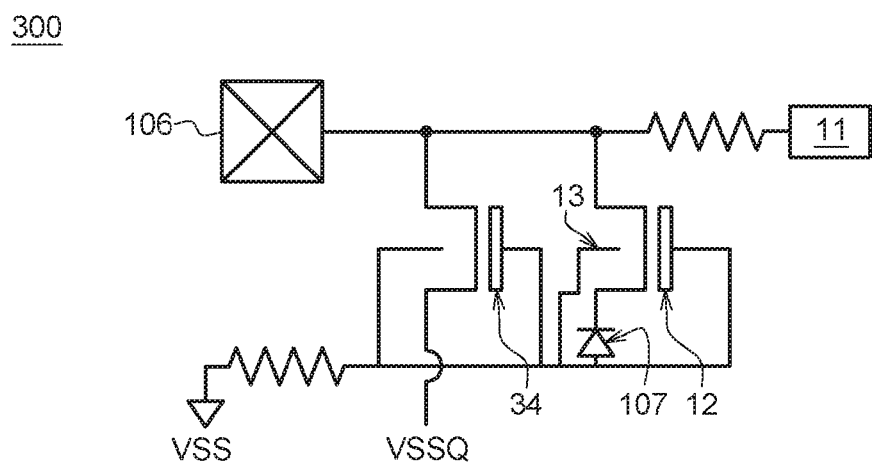
FIG. 3B illustrates an equivalent circuit diagram of the ESD protection apparatus depicted in FIG. 3A.

FIG. 3A is a cross-sectional view illustrating an ESD protection apparatus 300 in accordance with yet another embodiment of the present invention. FIG. 3B illustrates an equivalent circuit diagram of the ESD protection apparatus 300 depicted in FIG. 3A. The structure of the ESD protection apparatus 300 is similar to that of the ESD protection apparatus 100 which is depicted in FIGS. 1A and 1B except that the gate 308 (including a second gate dielectric layer 308a and a second gate electrode 308b) of the NMOS transistor 34 is directly connected to the ground (VSS) rather than connecting to the I/O circuit 15. In this case, the pad 106 thus can merely serve as an input pad used to receiving signal during a normal operation.

Figure 4:
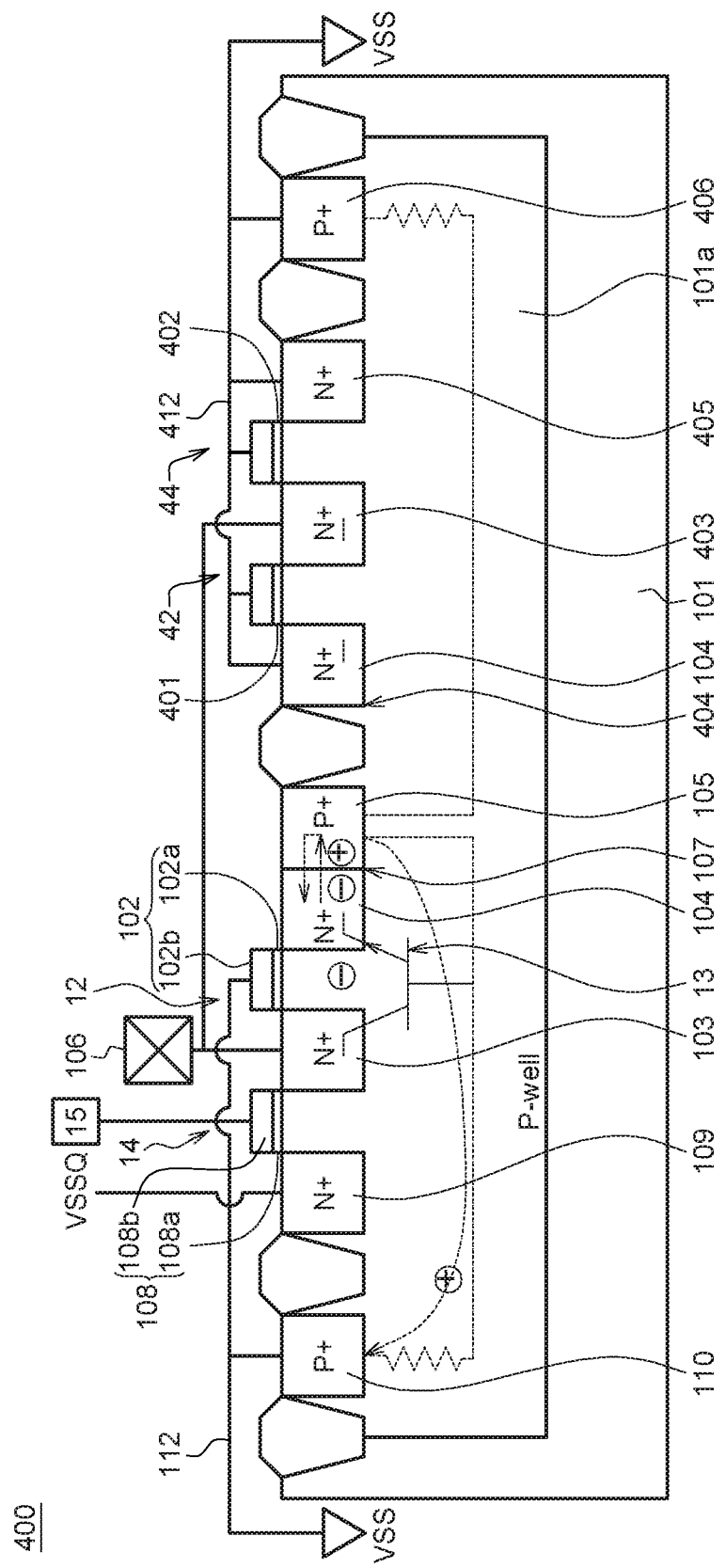
FIG. 4 is a cross-sectional view illustrating an ESD protection apparatus in accordance with yet another embodiment of the present invention.

In addition, the ESD protection apparatus can include more MOS transistors formed in the doping well. For example, FIG. 4 is a cross-sectional view illustrating an ESD protection apparatus 400 in accordance with yet another embodiment of the present invention the. The structure of the ESD protection apparatus 400 is similar to that of the ESD protection apparatus 100 which is depicted in FIG. 1B except that the ESD protection apparatus 400 further includes a plurality gate structures, such as the gate structures 401 and 402 formed on the doping well 101a, a plurality of n-type doping regions, such of doping regions 403, 404 and 405, as well as a p-type doping region 406 formed in the doping well 101a. Wherein the combinations of the gate structures 401 and 402 and the n-type doping regions 403, 404 and 405 can respectively form a plurality of NMOS transistors, such as NMOS transistors 41 and 42.

The gate structure 401 and the source (the n-type doping region 404) of the NMOS transistor 41 are connected to the ground (VSS) through the conductive line 112; the drain (the n-type doping region 403) of the NMOS transistor 42 is connected to the pad 106; the gate structure 402 and the source (the n-type doping region 405) of the NMOS transistor 42 are connected to the ground (VSS) through the conductive line 112; and the NMOS transistors 41 and 42 have a common drain (the n-type doping region 403). The p-type doping region 406 is disposed on the side of the NMOS transistors 44 departing from the NMOS transistors 42 and is connected to the ground (VSS) through the conductive line 412.

When the parasitic NPN BJT circuit 13 of the MOS transistor 12 is triggered by an high-forward-voltage, the ESD current that are directed into the MOS transistor 12 through the input (or output) pad 106 may drive charge carriers, such as free electrons and holes, coming from the base (the doping well 101a) of the parasitic NPN BJT 13 tunneling through the P/N junction interface 107. Such that, the ESD current can be directed into the doping well 101a and then flowing into the ground (designated as VSS), meanwhile the substrate bias of the doping well 101a can be increased, the breakthrough voltage of the MOS transistors 14, 41 and 42 can be reduced by the increased substrate bias, and the MOS transistors 14, 41 and 42 that are formed in the doping well 101a can be turn on simultaneously for discharging the ESD current.

Figure 5:
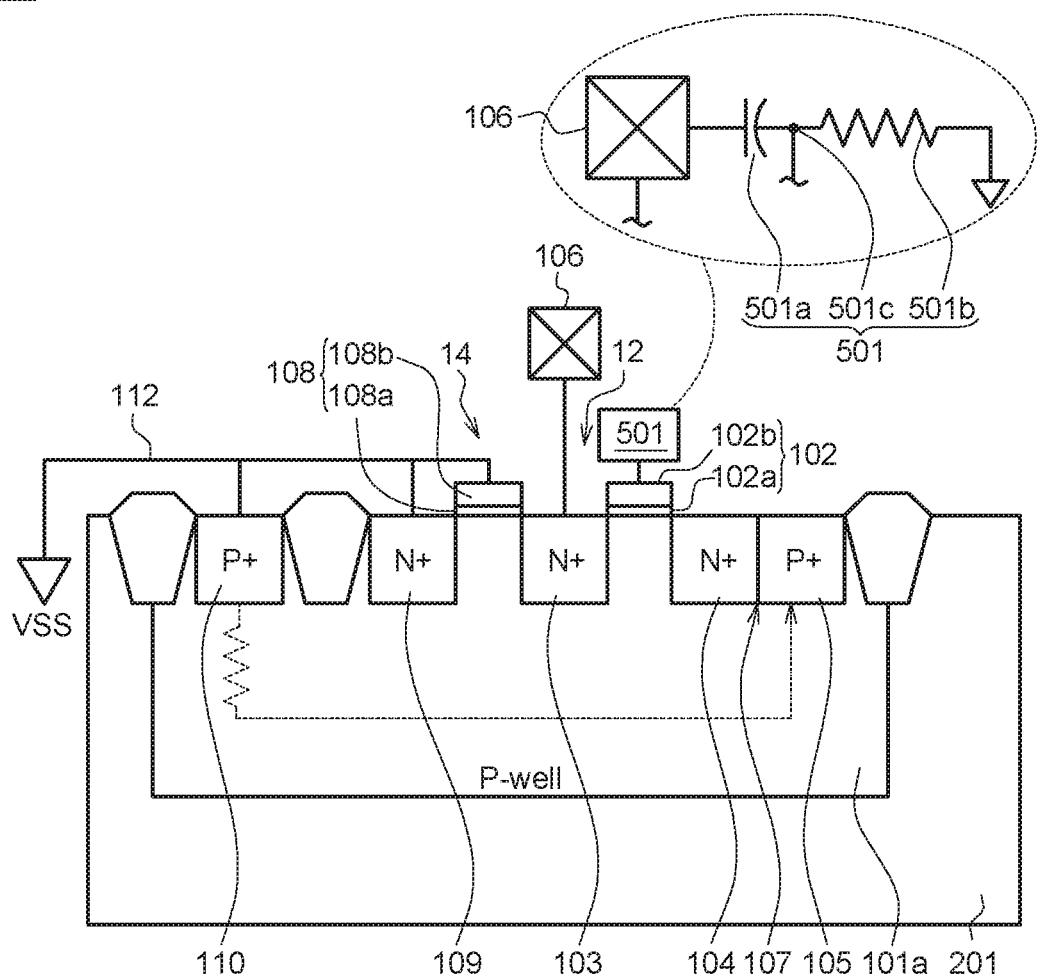
FIG. 5 is a cross-sectional view illustrating an ESD protection apparatus in accordance with yet another embodiment of the present invention.

In order to improve the performance of the ESD protection apparatus, the ESD protection apparatus may further include a control circuit electrically connected to the MOS transistor that is firstly triggered by the ESD current. FIG. 5 is a cross-sectional view illustrating an ESD protection apparatus 500 in accordance with yet another embodiment of the present invention. The structure of the ESD protection apparatus 500 is similar to that of the ESD protection apparatus 300 which is depicted in FIG. 3A except that the ESD protection apparatus 500 further includes a control circuit 501 couple on the gate electrode 102b of the gate structure 102.

In some embodiments of the present disclosure, the control circuit 501 includes a capacitor 501a and a resistor 501b. One end of the capacitor 501a is electrically connected to the pad 106, and the other end of the capacitor 501a is electrically connected to the gate electrode 102b of the first gate structure 102. The resistor 501b is electrically connected to a nod 501c disposed between the capacitor 501a and the gate electrode 102b. High-frequency current. When the ESD protection apparatus 500 is subjected to ESD stress, ESD current with high-frequency can pass through the uncharged capacitor 501a within a delay time interval, the NMOS transistor 12 thus can be triggered in advance.

In some other embodiments, the control circuit 501 can merely include one single resistor 501b electrically connected to the gate electrode 102b of the first gate structure 102. In this case, the parasitic capacitor (not show) formed between the resistor 501b and the gate electrode 102b may work for triggering the NMOS transistor 12 in advance.

Figure 6:
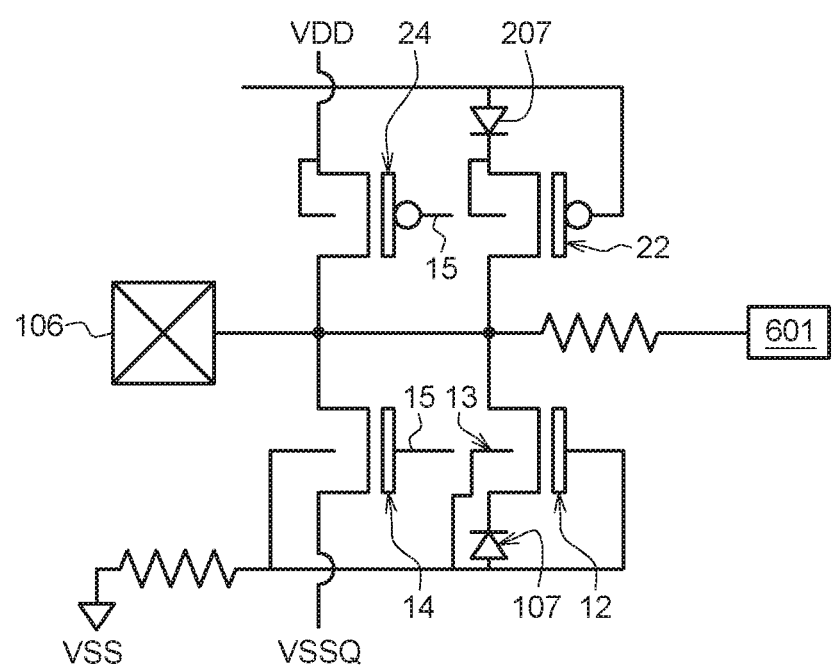
FIG. 6 illustrates a circuit diagram of a memory device applying the ESD protection apparatuses depicted in FIGS. 1A and 2.

The aforementioned ESD protection apparatus can be applied in a memory device. For example, FIG. 6 illustrates a circuit diagram of a memory device 60 applying the ESD protection apparatuses 100 and 200 respectively depicted in FIGS. 1A and 2. In the present embodiment, the memory device 60 includes at least one memory cell array 601 electrically connected to an external circuit through pad 106 as well as electrically connected to the ESD protection apparatuses 100 and 200. As discussed above, the ESD protection apparatuses 100 and 200 can protect the memory cell array 601 from being damaged by ESD stress.

In accordance with the aforementioned embodiments of the present disclosure, an ESD protection apparatus and applications thereof are provided. The ESD protection apparatus includes a MOS transistor and a doping region both formed in a doping well of a semiconductor substrate, wherein the MOS transistor has a conductivity different from that of the doping well; the doping region has a conductivity identical to that of the doping well; and the doping region forms a P/N junction interface with a source (or drain) of the MOS transistor. One end of the doping well is grounded; the drain (or source) of the MOS transistor that is not used to form the P/N junction interface is electrically connected to an input (or output) pad; and the concentrations of the doping region and the source/drain of the MOS transistor are substantially greater than that of the doping well.

Because the doping region and the source (or drain) of the MOS transistor used to form the P/N junction interface have concentrations substantially greater than that of the doping well. The reverse breakdown voltage of the P/N junction interface could be small enough to be ignored. When the parasitic BJT circuit of the MOS transistor is triggered by high-voltage, the ESD current that is directed into the MOS transistor through the input (or output) pad may drive the, charge carriers, such as free electrons and holes, coming from the base of the parasitic BJT tunneling through the P/N junction interface. Such that, the ESD current can be directed into the doping well, meanwhile the substrate bias of the doping well can be increased, the breakthrough voltage of the MOS transistor can be reduced by the increased substrate bias, and the other MOS transistors that are formed in the doping well can be turn on simultaneously for discharging the ESD current.

By this approach, the MOS transistors with multi-finger-shaped structure formed in the doping well can be turn-on more uniformly, and the overloaded and burnt down problems of the particular MOS transistor due to non-uniform turn-on can be solved.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An electrostatic discharge (ESD) protection apparatus, used to protect an internal circuit from being damaged by an ESD current, and comprising:
   a semiconductor substrate, having a doping well with a first conductivity, wherein one end of the doping well is grounded;
   a first gate structure, disposed on the doping well;
   a first doping region, having a second conductivity, disposed in the doping well and adjacent to the first gate structure, and electrically connected to a pad that is connected to the internal circuit to direct the ESD current into the doping well and then flowing into a ground;
   a second doping region, having the second conductivity, disposed in the doping well and adjacent to the first gate structure; and
   a third doping region, having the first conductivity, disposed in the doping well, and forming a P/N junction interface with the second doping region;

wherein the second doping region and the third doping region respectively have a doping concentration substantially greater than that of the doping well.

2. The ESD protection apparatus according to claim 1, further comprising:
   a second gate structure, disposed on the doping well and adjacent to the first doping region;
   a fourth doping region, having the second conductivity, disposed in the doping well and adjacent to the second gate structure, and connected to the ground; and
   a fifth doping region having the first conductivity, disposed in the doping well, and connected to the ground.

3. The ESD protection apparatus according to claim 2, wherein the second gate structure is grounded.

4. The ESD protection apparatus according to claim 2, further comprising an input/output (I/O) circuit electrically connected to the second gate structure.

5. The ESD protection apparatus according to claim 2, further comprising:
   a third gate structure, disposed on the doping well;
   a sixth doping region, having the second conductivity, disposed in the doping well and adjacent to the third gate structure, and connected to the pad; and
   a seventh doping region, having the second conductivity, disposed in the doping well and adjacent to the third gate structure, and connected to the ground; and
   an eighth doping region, having the first conductivity, disposed in the doping well, and connected to the ground.

6. The ESD protection apparatus according to claim 1, wherein the first gate structure is grounded or connected to a control circuit.

7. The ESD protection apparatus according to claim 6, wherein the control circuit comprises:
   a capacitor, one end of which is electrically connected to the pad, and the other end of which is electrically connected to the first gate structure; and
   a resistor, electrically connected to a nod disposed between the capacitor and the first gate structure.

8. The ESD protection apparatus according to claim 1, wherein the doping well has a doping concentration substantially ranging from $1.0\times10^{16}/cm^3$ to $1.0\times10^{17}/cm^3$; the second doping region and the third doping region respectively have a doping concentration ranging from $1.0\times10^{19}/cm^3$ to $1.0\times10^{20}/cm^3$; and the P/N junction interface has a reverse breakdown voltage ranging from 0.7V to 3V.

9. A memory device, comprising:
   an internal circuit;
   an ESD protection apparatus, used to protect the internal circuit from being damaged by an ESD current, and comprising:
   a semiconductor substrate, having a doping well with a first conductivity, wherein one end of the doping well is grounded;
   a first gate structure, disposed on the doping well;
   a first doping region, having a second conductivity, disposed in the doping well and adjacent to the first gate structure, and electrically connected to a pad that is connected to the internal circuit to direct the ESD current into the doping well and then flowing into a ground;
   a second doping region, having the second conductivity, disposed in the doping well and adjacent to the first gate structure; and
   a third doping region, having the first conductivity, disposed in the doping well, and forming a P/N junction interface with the second doping region;
   wherein the second doping region and the third doping region respectively have a doping concentration substantially greater than that of the doping well; and
   a memory cell array electrically connected to the pad of the ESD protection apparatus.

10. The memory device according to claim 9, further comprising:
   a second gate structure, disposed on the doping well and adjacent to the first doping region;
   a fourth doping region, having the second conductivity, disposed in the doping well and adjacent to the second gate structure, and connected to the ground; and
   a fifth doping region having the first conductivity, disposed in the doping well, and connected to the ground.

11. The memory device according to claim 10, wherein the second gate structure is grounded.

12. The memory device according to claim 10, further comprising an input/output (I/O) circuit electrically connected to the second gate structure.

13. The memory device according to claim 10, further comprising:
   a third gate structure, disposed on the doping well;
   a sixth doping region, having the second conductivity, disposed in the doping well and adjacent to the third gate structure, and connected to the pad; and
   a seventh doping region, having the second conductivity, disposed in the doping well and adjacent to the third gate structure, and connected to the ground; and
   an eighth doping region, having the first conductivity, disposed in the doping well, and connected to the ground.

14. The memory device according to claim 9, wherein the first gate structure is grounded or connected to a control circuit.

15. The memory device according to claim 14, wherein the control circuit comprises:
   a capacitor, one end of which is electrically connected to the pad, and the other end of which is electrically connected to the first gate structure; and
   a resistor, electrically connected to a nod disposed between the capacitor and the first gate structure.

16. The memory device according to claim 9, wherein the doping well has a doping concentration substantially ranging from $1.0\times10^{16}/cm^3$ to $1.0\times10^{17}/cm^3$; the second doping region and the third doping region respectively have a doping concentration ranging from $1.0\times10^{19}/cm^3$ to $1.0\times10^{20}/cm^3$; and the P/N junction interface has a reverse breakdown voltage ranging from 0.7V to 3V.

17. An ESD protection method, comprising:
   providing an EDS protection apparatus electrically connected to an internal circuit for protecting the internal circuit from being damaged by an ESD current, wherein the ESD protection apparatus comprises:
   a semiconductor substrate, having a doping well with a first conductivity, wherein one end of the doping well is grounded;
   a first gate structure, disposed on the doping well;
   a first doping region, having a second conductivity, disposed in the doping well and adjacent to the first gate structure, and electrically connected to a pad that is connected to the internal circuit;
   a second doping region, having the second conductivity, disposed in the doping well and adjacent to the first gate structure; and
   a third doping region, having the first conductivity, disposed in the doping well, and forming a P/N junction interface with the second doping region;

wherein the second doping region and the third doping region respectively have a doping concentration substantially greater than that of the doping well; and applying the ESD protection apparatus to direct the ESD current into the doping well through the pad, passing through the substrate and then flowing into a ground, when an ESD current is imposed on the pad.

* * * * *